US010777966B1

United States Patent
Shepsis et al.

(10) Patent No.: US 10,777,966 B1
(45) Date of Patent: Sep. 15, 2020

(54) MIXED-FLOW COOLING TO MAINTAIN COOLING REQUIREMENTS

(71) Applicant: Lockheed Martin Corporation, Bethesda, MD (US)

(72) Inventors: Aleksandra Shepsis, Lynnwood, WA (US); Shuming Yuan, Bothell, WA (US)

(73) Assignee: Lockheed Martin Corporation, Bethesda, MD (US)

( * ) Notice: Subject to any disclaimer, the term of this patent is extended or adjusted under 35 U.S.C. 154(b) by 169 days.

(21) Appl. No.: 15/846,191

(22) Filed: Dec. 18, 2017

(51) Int. Cl.
*H01S 5/02* (2006.01)
*H01S 5/024* (2006.01)
*H01S 5/40* (2006.01)

(52) U.S. Cl.
CPC ...... *H01S 5/02423* (2013.01); *H01S 5/02476* (2013.01); *H01S 5/4025* (2013.01)

(58) Field of Classification Search
CPC ............... H01S 5/02476; H01S 5/4025; H01S 5/02423; F28D 7/1607; F28D 7/08; F28D 7/082; F28D 7/085; F28D 1/05375; F28F 9/22; F28F 13/08; F28F 2250/06; F28F 2250/102; H05K 7/20281
See application file for complete search history.

(56) References Cited

U.S. PATENT DOCUMENTS

| | | | | |
|---|---|---|---|---|
| 3,528,492 | A * | 9/1970 | Austin ...................... | H01Q 1/02 165/80.4 |
| 5,105,429 | A | 4/1992 | Mundinger et al. | |
| 6,052,284 | A * | 4/2000 | Suga ...................... | H01L 23/473 361/699 |
| 6,888,725 | B2 * | 5/2005 | Kubo ........................ | G06F 1/20 257/721 |
| 6,935,419 | B2 * | 8/2005 | Malone ..................... | F28F 3/02 165/146 |
| 7,065,107 | B2 | 6/2006 | Hamilton et al. | |
| 7,199,924 | B1 | 4/2007 | Brown et al. | |
| 7,386,211 | B1 | 6/2008 | Di Teodoro et al. | |
| 7,471,705 | B2 | 12/2008 | Gerstenberger et al. | |
| 7,526,167 | B1 | 4/2009 | Minelly | |
| 7,539,231 | B1 | 5/2009 | Honea et al. | |
| 7,620,077 | B2 | 11/2009 | Henderson | |
| 7,652,884 | B2 * | 1/2010 | Suzuki .................... | G06F 1/203 165/80.4 |

(Continued)

*Primary Examiner* — Tho V Duong
(74) *Attorney, Agent, or Firm* — Charles A. Lemaire; Jonathan M. Rixen; Lemaire Patent Law Firm, P.L.L.C.

(57) ABSTRACT

An apparatus that includes a plurality of heat sources; a heat sink coupled to the plurality of heat sources; a heat-exchange-fluid flow path for heat-exchange fluid to flow through such that heat is removed from the heat sink, wherein the flow path includes: a heat-exchange-fluid inlet, a first branch that includes a plurality of segments including a first and second segment, wherein each of the plurality of segments includes an upstream end and a downstream end, wherein a first portion of the heat-exchange fluid flows through the first segment in a first direction and the first portion of the heat-exchange fluid flows through the second segment in a second direction, opposite the first direction, and a second branch, wherein a second portion of the heat-exchange fluid flows through the second branch such that the second portion of the heat-exchange fluid mixes with the downstream end of the second segment.

23 Claims, 6 Drawing Sheets

(56) References Cited

U.S. PATENT DOCUMENTS

| | | |
|---|---|---|
| 7,671,337 B1 | 3/2010 | Tidwell |
| 7,768,700 B1 | 8/2010 | Savage-Leuchs |
| 7,792,166 B2 | 9/2010 | Borschowa |
| 7,872,794 B1 | 1/2011 | Minelly et al. |
| 8,355,608 B2 | 1/2013 | Hu |
| 8,411,712 B2 | 4/2013 | Honea et al. |
| 8,441,718 B2 | 5/2013 | Mead |
| 8,526,110 B1 | 9/2013 | Honea et al. |
| 9,472,487 B2 * | 10/2016 | Koontz ............... H01L 23/4332 |
| 2002/0110165 A1 | 8/2002 | Filgas |
| 2009/0185592 A1 | 7/2009 | Vetrovec |
| 2012/0080785 A1 * | 4/2012 | Johnson ................ H01L 23/433 257/713 |
| 2013/0031895 A1 * | 2/2013 | Glaser ....................... F28F 3/02 60/320 |
| 2015/0107801 A1 * | 4/2015 | Campbell ............ H05K 7/2039 165/104.33 |
| 2017/0051986 A1 * | 2/2017 | Jocham .................... F28F 3/12 |

\* cited by examiner

MIXED-FLOW COOLING TO MAINTAIN COOLING REQUIREMENTS

CROSS-REFERENCE TO RELATED APPLICATIONS

This application is related to
- U.S. Pat. No. 7,526,167 issued Apr. 28, 2009 to John D. Minelly, titled "Apparatus and method for a high-gain double-clad amplifier";
- U.S. patent application Ser. No. 11/165,676 titled "Apparatus and Method for Driving Laser Diodes" filed Jun. 24, 2005, by Lawrence A. Borschowa (which issued as U.S. Pat. No. 7,792,166 on Sep. 7, 2010);
- U.S. Pat. No. 7,620,077 issued Nov. 17, 2009 to Angus J. Henderson, titled "Apparatus and method for pumping and operating optical parametric oscillators using DFB fiber lasers";
- U.S. Pat. No. 7,539,231 issued May 26, 2009 to Eric C. Honea et al., titled "Apparatus and method for generating controlled-linewidth laser-seed-signals for high-powered fiber-laser amplifier systems";
- U.S. Pat. No. 7,471,705 issued Dec. 30, 2008 to David C. Gerstenberger et al., titled "Ultraviolet laser system and method having wavelength in the 200-nm range";
- U.S. Pat. No. 7,386,211 issued Jun. 10, 2008, to Fabio Di Teodoro et al., titled "Method and apparatus for spectral-beam combining of megawatt-peak-power beams from photonic-crystal rods";
- U.S. Pat. No. 7,671,337 titled "System and Method for Pointing a Laser Beam" that issued Mar. 2, 2010 to Steven C. Tidwell;
- U.S. Pat. No. 7,199,924 issued Apr. 3, 2007, by Andrew J. W. Brown et al., titled "Apparatus and method for spectral-beam combining of high-power fiber lasers";
- U.S. Pat. No. 7,768,700 issued Aug. 3, 2010 to Matthias P. Savage-Leuchs, titled "Method and Apparatus for Optical Gain Fiber having Segments of Differing Core Sizes";
- U.S. Patent Application Publication US 2008/0077200, titled "Apparatus and Method for Stimulation of Nerves and Automated Control of Surgical Instruments," filed Sep. 28, 2006 by Mark P. Bendett et al. (now abandoned);
- U.S. Pat. No. 7,872,794 issued Jan. 18, 2011, by John D. Minelly et al., titled "High-energy eye-safe pulsed fiber amplifiers and sources operating in erbium's L-band";
- U.S. Pat. No. 7,065,107 issued Jun. 20, 2006, by Charles E. Hamilton et al., titled "Spectral beam combination of broad-stripe laser diodes";
- U.S. Pat. No. 8,526,110 issued Sep. 3, 2013, by Eric C. Honea et al., titled "Spectral-beam combining for high-power fiber-ring-laser systems";
- U.S. Pat. No. 8,441,718 issued May 14, 2013, by Roy D. Mead, titled "Spectrally beam combined laser system and method at eye-safer wavelengths";
- U.S. Pat. No. 8,355,608 issued Jan. 15, 2013, by Yongdan Hu titled "Method and Apparatus for In-Line Fiber-Cladding-Light Dissipation"; and
- U.S. Pat. No. 8,411,712 issued Apr. 2, 2013, by Eric C. Honea et al., titled "Beam diagnostics and feedback system and method for spectrally beam-combined lasers";

each of which is incorporated herein by reference in its entirety.

FIELD OF THE INVENTION

The invention relates generally to temperature-control systems and more particularly to a system and method for enhancing stability of electronics, computers, and/or high-power lasers by, for example, controlling the temperature of an array of electronic devices such as pump-laser diodes by mixing cool heat-exchange fluid with warm heat-exchange fluid in a plurality of locations along a heat-exchanger plate connected to the array.

BACKGROUND OF THE INVENTION

Spectrally beam combined (SBC) fiber laser technology is established as the preferred solution for directed-energy laser weapon systems because it has demonstrated high E-O efficiency, improved SWaP (Space, Weight, and Power), and system robustness. An SBC high-power laser is composed of several fiber-laser modules (FLMs) whose beams are then combined into a single output beam. Each fiber-laser module contains a stack of pump-laser diodes that convert electric power to optical output. To maintain good system performance and efficiency, these pump-laser diodes need to be maintained at a precise temperature across all stacks. To meet SWaP requirements, it is preferable to design cooling plates with minimum pressure and flow requirements, while still maintaining tight temperature gradients for optimal pump-laser diode performance.

Some conventional temperature-control systems increase the flow rate by at least two times (i.e., 2× flow), and this additional flow rate increases system size and weight, which are key design discriminators at the system level. In high-power laser applications on platforms such as aircraft, for example, low coolant flow is desired in order to reduce overall weight and compact design. In fact, lower volumetric flow of coolant is preferred for some embodiments of many high-power laser systems.

U.S. Pat. No. 5,105,429 titled "MODULAR PACKAGE FOR COOLING A LASER DIODE ARRAY" by David C. Mundinger et al. (hereinafter, Mundinger et al.) issued Apr. 14, 1992, and is incorporated herein by reference. Mundinger et al. describe a laser diode array that includes a plurality of planar packages and active cooling. The laser diode array may be operated in a long duty cycle, or in continuous operation. A laser diode bar and a microchannel heat sink are thermally coupled in a compact, thin planar package having the laser diode bar located proximate to one edge. In an array, a number of such thin planar packages are secured together in a stacked configuration, in close proximity so that the laser diodes are spaced closely. The cooling means includes a microchannel heat sink that is attached proximate to the laser bar so that it absorbs heat generated by laser operation. To provide the coolant to the microchannels, each thin planar package comprises a thin inlet manifold and a thin outlet manifold connected to an inlet corridor and an outlet corridor. The inlet corridor comprises a hole extending through each of the packages in the array, and the outlet corridor comprises a hole extending through each of the packages in the array. The inlet and outlet corridors are connected to a conventional coolant circulation system. The laser diode array with active cooling has application as an optical pump for high power solid state lasers. Further, it can be incorporated in equipment such as communications devices and active sensors, and in military and space applications, and it can be useful in applications having space constraints and energy limitations.

U.S. Patent Application Publication 2002/0110165 titled "METHOD AND SYSTEM FOR COOLING AT LEAST ONE LASER DIODE WITH A COOLING FLUID" by David M. Filgas (hereinafter, Filgas) published Aug. 15, 2002, and is incorporated herein by reference. Filgas describes a method and system for cooling at least one laser diode with a cooling fluid which does not come into direct contact with the at least one laser diode. Liquid cooled heat sinks are provided on opposing sides of each laser diode. Individual modules are held together by a single holding mechanism allowing individual modules to be removed from the array for easy testing or replacement.

U.S. Patent Application Publication 2009/0185592 titled "LASER DIODE SYSTEM WITH REDUCED COOLANT CONSUMPTION" by Jan Vetrovec (hereinafter, Vetrovec) published Jul. 23, 2009, and is incorporated herein by reference. Vetrovec describes a high-power laser diode system offering reduced consumption and inventory of coolant. The invention provides coolant at a very high flow rate to a heat exchanger. A portion of the coolant flow downstream of the heat exchanger is separated and pumped by a fluid-dynamic pump back into the heat exchanger. The fluid dynamic pump is operated by a fresh coolant supplied at high-pressure. Because a substantial portion of the flow leaving the heat exchanger is recirculated back to the inlet, the amount of fresh coolant consumed is substantially reduced compared to a traditional laser diode system. This enables reduced size of coolant lines and results in a more compact and lightweight system. Other uses of the invention include cooling of devices requiring heat rejection at very high heat flux including photovoltaic cells, solar panels, semiconductor laser diodes, semiconductor electronics, and laser gain medium.

There is a need for improved temperature-control methods and apparatus for high-power laser systems.

SUMMARY OF THE INVENTION

In some embodiments, the present invention provides one or more paths for cold heat-exchange fluid to mix with hotter heat-exchange fluid midstream in the heat-removal path (i.e., downstream of the heat-exchange-fluid inlet of the heat-exchanger plate (also called a cooling plate or a heat-transfer plate) and upstream of the heat-exchange-fluid outlet of the heat-exchanger plate), which reduces the overall volumetric-flow requirement needed to maintain a desired degree of temperature uniformity across pump-laser diodes coupled to the heat-exchanger plate. More specifically, in some embodiments, the present invention reduces the temperature difference between pump-laser diodes located upstream (pump-laser diodes that are nearer the fluid inlet) and downstream (pump-laser diodes that are nearer the fluid outlet) along the flow path through the heat-exchanger plate fluid system.

In some embodiments, the present invention provides a fluid flow along a heat-exchanger plate, wherein the flow is caused, at least in part, by a pressure difference between the fluid inlet and the fluid outlet. In some embodiments, the present invention provides an inventive flow-channel system for a heat-exchanger plate that changes the flow velocity of coolant along its flow path so as to vary the forced-convection heat-transfer coefficient in order to make more equal the amount of heat removed (i.e., the heat-removal rate) from each pump-laser diode. In some embodiments, the coolant nearer the upstream end of the heat-exchanger-plate flow path (i.e., where the coolant has a lower temperature) has a lower flow velocity and therefore lower heat-transfer coefficient. In some embodiments, the coolant on the downstream side of the heat-exchanger-plate flow path (i.e., where the coolant has a higher temperature) has a higher flow velocity and therefore higher heat-transfer coefficient. In some such embodiments, the heat-transfer coefficient controlled by fluid velocity compensates for the increasing temperature of coolant itself as the coolant moves downstream along the heat-exchanger-plate flow path. In other words, the lower difference of temperature (i.e., $\Delta T$) between the laser pump-laser diodes and the adjacent coolant nearer the fluid outlet is compensated by higher heat-transfer coefficient achieved by increasing the fluid velocity to achieve a more equal temperature of all the pump-laser diodes (or other heat sources).

In some embodiments, a more equal temperature of all the pump-laser diodes is achieved by (1) introducing lower-temperature coolant at one or more midstream locations along the fluid flow path adjacent the heat-exchanger plate and mixing the lower-temperature coolant with the higher-temperature fluid arriving from cooling the upstream pump-laser diodes (thus increasing the $\Delta T$ for pump-laser diodes nearer the fluid outlet relative to systems that do not introduce lower-temperature coolant at midstream locations), and/or (2) by increasing the coolant flow rate for pump-laser diodes nearer the fluid outlet relative to the coolant flow rate for pump-laser diodes nearer the fluid inlet, and/or (3) by increasing the surface area of the heat-exchanger plate that is in contact with the coolant for pump-laser diodes nearer the fluid outlet relative to the surface area of the heat-exchanger plate that is in contact with the coolant for pump-laser diodes nearer the fluid inlet.

In some embodiments, the present invention provides a way to reduce overall volumetric flow rate in a pump-laser diode cooling system by mixing cold fluid with heated fluid downstream of the fluid inlet of the heat-exchanger plate. In some such embodiments, the present invention allows for tight pump-laser-diode temperature control with low volumetric flow.

In some embodiments, the present invention includes a path for cold liquid to mix with hotter fluid downstream of the heat-exchanger plate. In some such embodiments, the present invention reduces the requirements for overall volumetric flow, while still maintaining a very tight temperature control of the pump-laser diodes. In addition, in some embodiments, the present invention includes an inventive fluid-channel design that ensures good fluid mixing and distribution to maintain temperature uniformity of the pump-laser diodes mounted on the plate.

In some embodiments, the mixing-flow solution at the pump-laser diodes heat-exchanger plate of the present invention resolves the problems of conventional solutions (e.g., some conventional solutions increase the maximum temperature at the heat-exchanger plate, and attempt to increase surface area of the heat-exchanger plate in contact with the coolant, which adds to the thermal mass of the heat-exchanger plate and thus adversely impacts transient performance of the laser sub-system) by the present invention keeping maximum temperatures low and maintaining a smaller temperature delta between the various pump-laser diodes.

In some embodiments, the mixing-flow solution of the present invention improves system performance by keeping volumetric flow requirements down and optimizing transient performance with heat-exchanger plate temperatures more closely following coolant temperatures.

DETAILED DESCRIPTION

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the figures and described here may include features that are not included in all specific embodiments. A particular embodiment may include only a subset of all of the features described, or a particular embodiment may include all of the features described.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component that appears in multiple figures. Signals and connections may be referred to by the same reference number or label, and the actual meaning will be clear from its use in the context of the description.

Figure 1A:
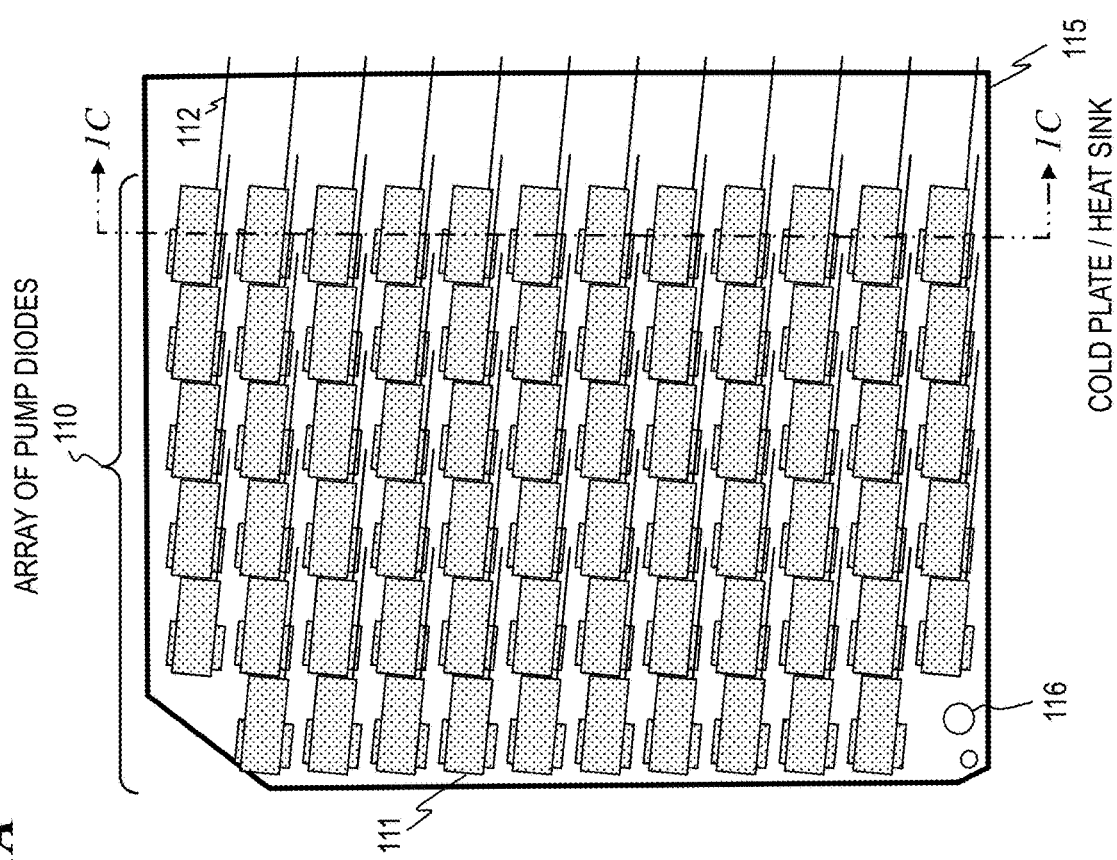
FIG. 1A is a schematic plan-view diagram of a temperature-control system 101, according to some embodiments of the present invention.

FIG. 1A is a schematic plan-view diagram of a temperature-control system 101, according to some embodiments of the present invention. In some embodiments, system 101 includes a pump-laser-diode array 110 coupled to a heat spreader (also called a heat sink or cold plate) 115. In some embodiments, temperature-control system 101 includes a heat-exchange-fluid inlet 116. In some embodiments, temperature-control system 101 is configured to transfer heat away from a heat source other than pump-laser-diode array 110 (e.g., in some embodiments, the heat source includes one or more electronic devices). In some embodiments, each pump-laser diode 111 of array 110 has a respective output fiber 112.

Figure 1C:
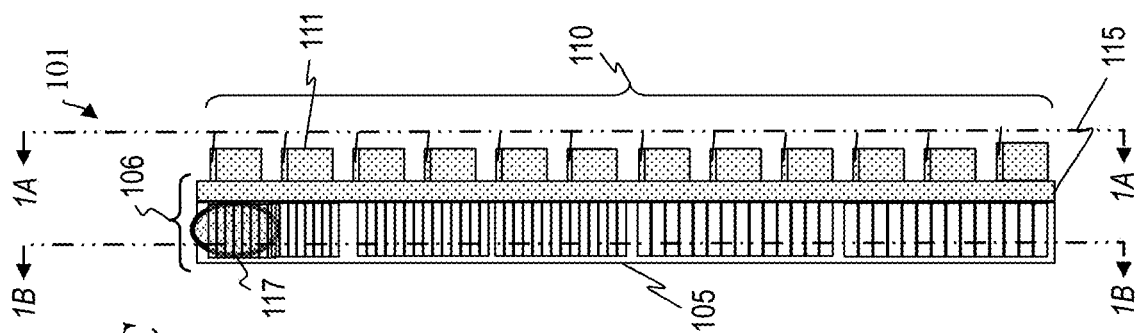
FIG. 1C is a schematic side cross-sectional view of temperature-control system 101, as viewed along dotted-line 1C-1C of FIG. 1A and FIG. 1B, according to some embodiments of the present invention.
Figure 1B:
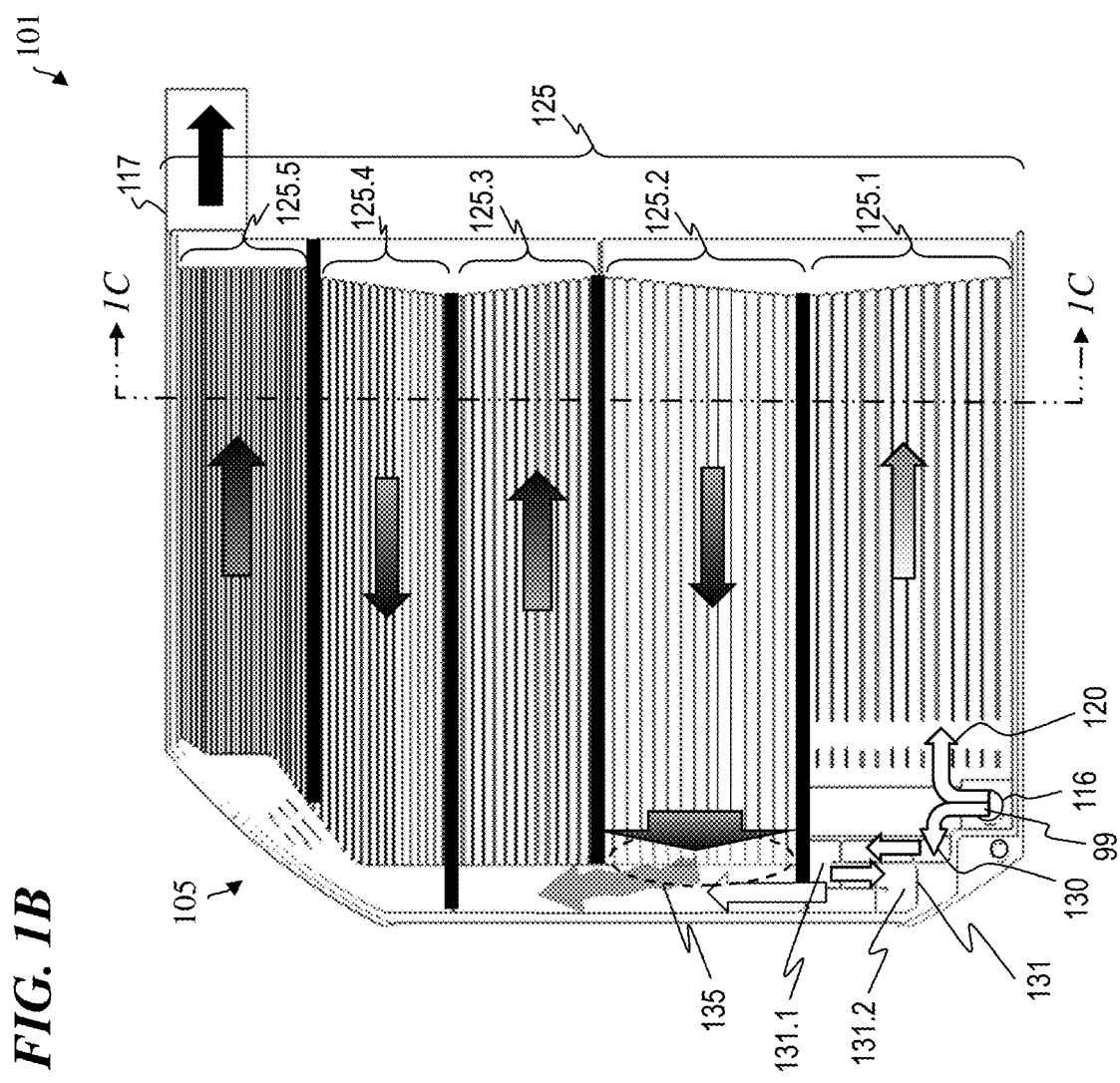
FIG. 1B is a schematic plan-view diagram of temperature-control system 101 showing a heat-exchange-fluid flow structure 105 that is coupled to and located against heat spreader (also called a heat sink or cold plate) 115 of FIG. 1A, according to some embodiments of the present invention.

FIG. 1B is a schematic plan-view diagram of temperature-control system 101 showing a heat-exchange-fluid flow structure 105 that is coupled to and located underneath heat spreader 115 of FIG. 1A, according to some embodiments of the present invention. In some embodiments, heat-exchange fluid 99 enters flow structure 105 via inlet 116. In some embodiments, heat-exchange fluid 99 is water; in other embodiments, heat-exchange fluid 99 includes water and another liquid or solute; in yet other embodiments, heat-exchange fluid 99 includes a non-aqueous specialty liquid-phase heat transfer fluid (a liquid other than water) and/or another liquid and/or solute; in still other embodiments, heat-exchange fluid 99 includes or is helium or other suitable gas.

In some embodiments, after entering flow structure 105, the heat-exchange fluid 99 separates into one of two branches: a primary branch 120 and a secondary bypass branch 130. In some embodiments, heat-exchange fluid 99 moving through flow structure 105 via primary branch 120 passes through a plurality of channel segments 125 (including, for example, channel segment 125.1, channel segment 125.2, channel segment 125.3, channel segment 125.4, and channel segment 125.5) that each have a plurality of channels. In some embodiments, the walls forming the channels in each channel segment 125.1, 125.2, . . . 125.n are continuous with (or coupled to) the portions of heat spreader 115 coupled to pump-laser-diode array 110 of FIG. 1A such that heat generated by pump-laser-diode array 110 is transferred away from array 110 and into the channel walls where it is then transferred into the heat-exchange fluid 99 flowing through the channels of each channel segment 125.1, 125.2, . . . 125.n. In some embodiments, after the heat-exchange fluid 99 has passed through the plurality of channel segments 125, the heat-exchange fluid 99 exits flow structure 105 via heat-exchange-fluid outlet 117. In some embodiments, heat-exchange fluid 99 flowing through flow structure 105 gets warmer as it flows away from inlet 116 and toward outlet 117.

In some embodiments, bypass branch 130 of flow structure 105 includes pressure-control conduit 131 that is configured to balance the flow and pressure drop of the heat-exchange fluid 99 flowing through branch 130 with the flow and pressure drop of the heat-exchange fluid 99 flowing through branch 120. In some embodiments, pressure-control conduit 131 is configured (by such features as adjusting its length L and/or its cross-sectional area A, changing the number of flow-reversal U-turns (e.g., U-turns 131.1 and 131.2), and the like) such that heat-exchange fluid 99 flows through conduit 131 in a parallel-flow pathway that controls the pressure drop of the heat-exchange fluid 99 across conduit 131 such that the desired balance of heat-exchange fluid 99 from branch 120 through segments 125.1 and 125.2, which each increase the temperature of the heat-exchange fluid 99, and the newly introduced cold heat-exchange fluid 99 from branch 130 that mixes with and moderates the temperature of the heat-exchange fluid 99 that then enters segment 125.3. In some embodiments, heat-exchange fluid 99 flowing through bypass branch 130 mixes with warmer heat-exchange fluid 99 flowing through branch 120 at one or more mixing locations 135 that are located downstream of inlet 116.

In some embodiments, the channel widths of the channels in each respective channel segment 125 get narrower as the respective segment 125 gets closer to outlet 117. For example, in some embodiments, the channel widths in the channel segment 125 closest to inlet 116 are the widest of all of the channel segments 125 and the channel widths in the channel segment 125 closest to outlet 117 are the narrowest of all of the channel segments 125. In some such embodiments, the varying channel widths cause the flow velocity of the heat-exchange fluid 99 to increase as the heat-exchange fluid 99 gets closer to outlet 117, and the increased flow velocity increases the heat transfer coefficient in order to compensate for the fact that the temperature of the heat-exchange fluid 99 itself will increase as it moves downstream along the flow structure 105 (i.e., increasing the heat transfer coefficient where the heat-exchange fluid 99 temperature is higher balances the amount of heat transfer occurring across flow structure 105, which allows system 101 to maintain even temperatures across all of the pump-laser diodes in array 110).

FIG. 1C is a schematic side cross-sectional view of system 101, as viewed along dotted-line 1C-1C of FIG. 1A and FIG. 1B, according to some embodiments of the present invention. As shown in FIG. 1C, the combination of flow path 105 and heat spreader 115 are referred to as heat exchanger 106.

Figure 2A:
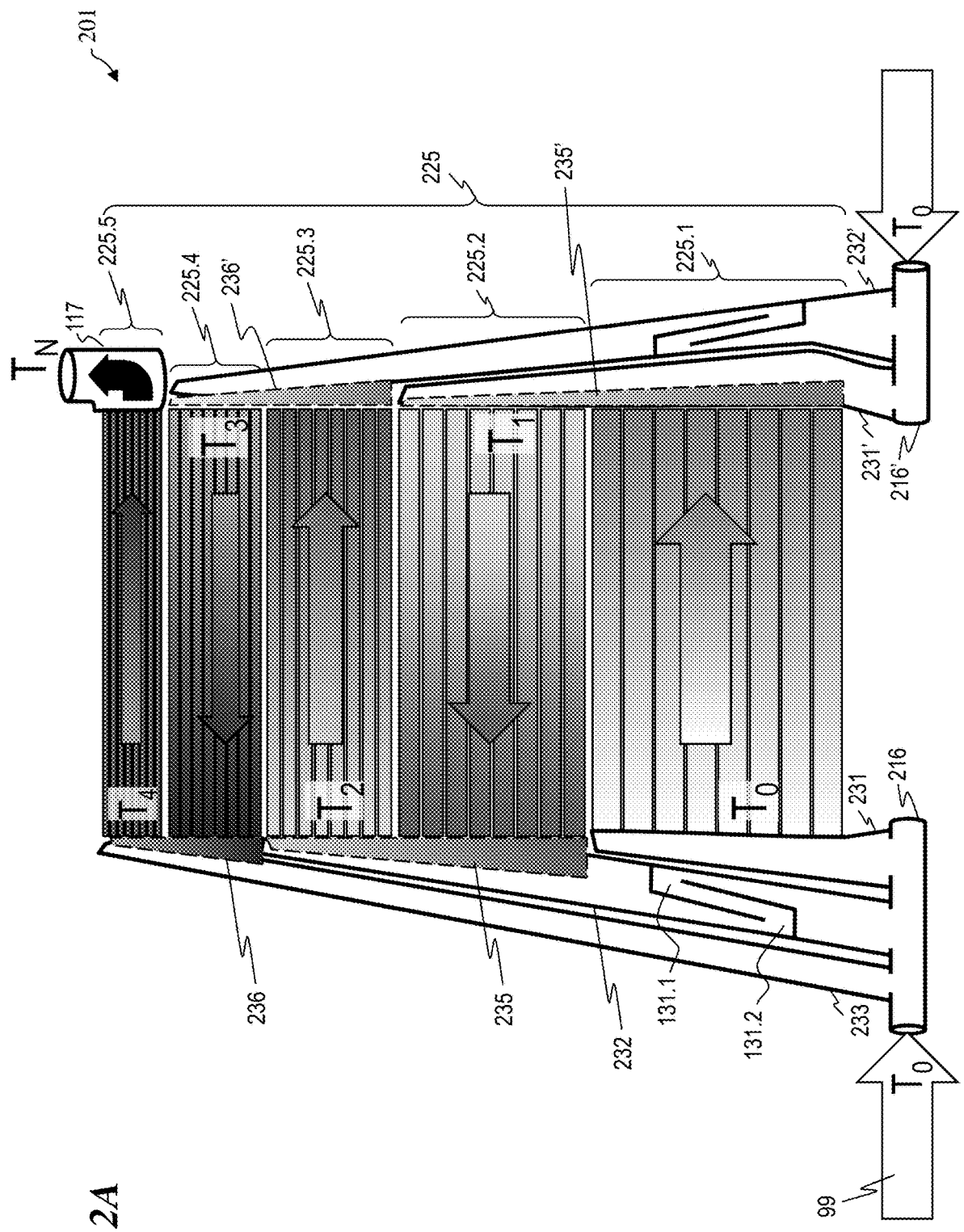
FIG. 2A is a schematic diagram of a temperature-control system 201, according to some embodiments of the present invention.

FIG. 2A is a schematic diagram of a temperature-control system 201, according to some embodiments of the present invention. In some embodiments, system 201 includes a plurality of channel segments 225 (e.g., segments 225.1, 225.2, 225.3, 225.4, and 225.5), each segment 225 having a plurality of channels in which heat-exchange fluid 99 is passed through to transfer heat away from one or more heat sources that are thermodynamically coupled to the walls of the channels (e.g., in some embodiments, the heat source(s) is an array of pump-laser diodes, one or more of various types of electronic devices, or any other suitable heat source(s) from which heat needs to be exchanged while maintaining all of the devices at about the same temperature). In some embodiments, system 201 includes a first heat-exchange-fluid inlet 216 on a first side of system 201 and a second heat-exchange-fluid inlet 216' on a second side of system 201 such that heat-exchange fluid 99 flowing through each respective channel segment 225 is cooler at the upstream end of the respective segment 225 than at the downstream end of the respective segment 225. FIG. 2A shows the change in temperature by varying shading across the parallel flow channels; for example, in some embodiments, the white and lighter grey represent cooler temperatures and black and darker grey representing hotter temperatures. In some embodiments, system 201 includes a plurality of inlet conduits 231, 232, and 233 coupled to inlet 216 where each respective inlet conduit guides cooler heat-exchange fluid 99 (i.e., heat-exchange fluid at the inlet temperature $T_0$) from inlet 216 to a respective segment 225 on a first side of the respective segment 225. For example, conduit 231 introduces heat-exchange fluid 99 into the fluid channels of segment 225.1. In some such embodiments, heat-exchange fluid 99 guided to channel segment 225.2 via conduit 232 mixes with the warmer heat-exchange fluid 99 coming from channel segment 225.2 in mixing area 235 such that heat-exchange fluid 99 is at temperature $T_2$ at the start of channel segment 225.3, while heat-exchange fluid 99 guided to channel segment 225.4 via conduit 233 mixes with the warmer heat-exchange fluid 99 coming from channel segment 225.4 in mixing area 236 such that heat-exchange fluid 99 is at temperature $T_4$ at the start of channel segment 225.5. In some embodiments, system 201 includes a plurality of inlet conduits 231' and 232' coupled to inlet 216' where each respective inlet segment guides heat-exchange fluid 99 from inlet 216' to a respective segment 225 on a second side of the respective segment 225 (in some such embodiments, heat-exchange fluid 99 guided to channel segment 225.1 via conduit 231' mixes with the warmer heat-exchange fluid 99 coming from channel segment 225.1 in mixing area 235' such that heat-exchange fluid 99 is at temperature $T_1$ at the start of channel segment 225.2, while heat-exchange fluid 99 guided to channel segment 225.3 via conduit 232' mixes with the warmer heat-exchange fluid 99 coming from channel segment 225.3 in mixing area 236' such that heat-exchange fluid 99 is at temperature $T_3$ at the start of channel segment 225.4).

Figure 2B:
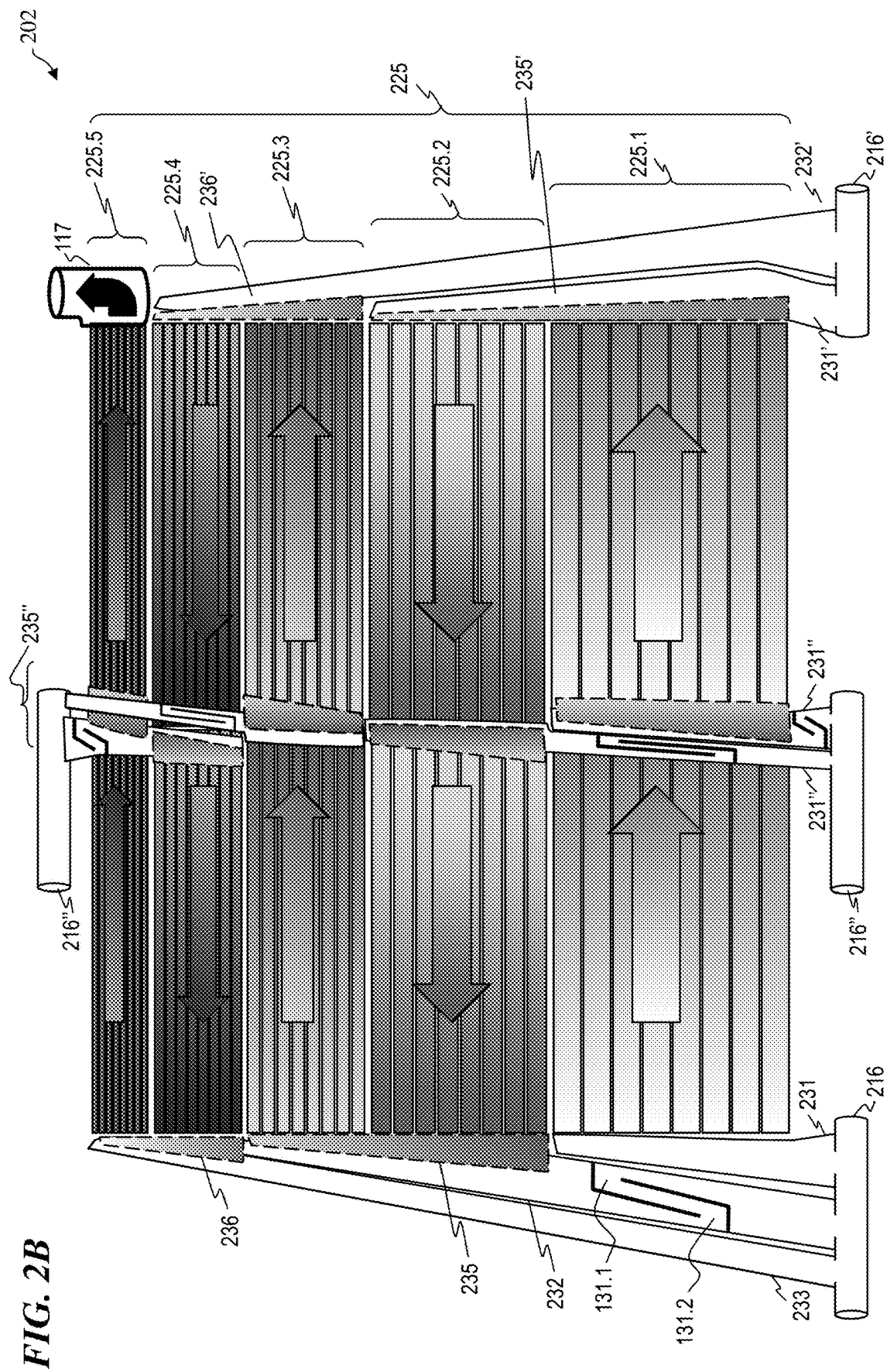
FIG. 2B is a schematic diagram of a temperature-control system 202, according to some embodiments of the present invention.

FIG. 2B is a schematic diagram of a temperature-control system 202, according to some embodiments of the present invention. In some embodiments, system 202 is substantially similar to system 201, except that system 202 further includes heat-exchange-fluid inlets 216" that supply fresh heat-exchange fluid 99 at midstream locations 235" of each of the plurality of channel segments 225 via conduits 231". In some such embodiments, conduits 231.1 provide fresh (i.e., cool) heat-exchange fluid 99 to a plurality of mixing areas 235.1 located at the midstream locations of each of the plurality of channel segments 225.

Figure 3:
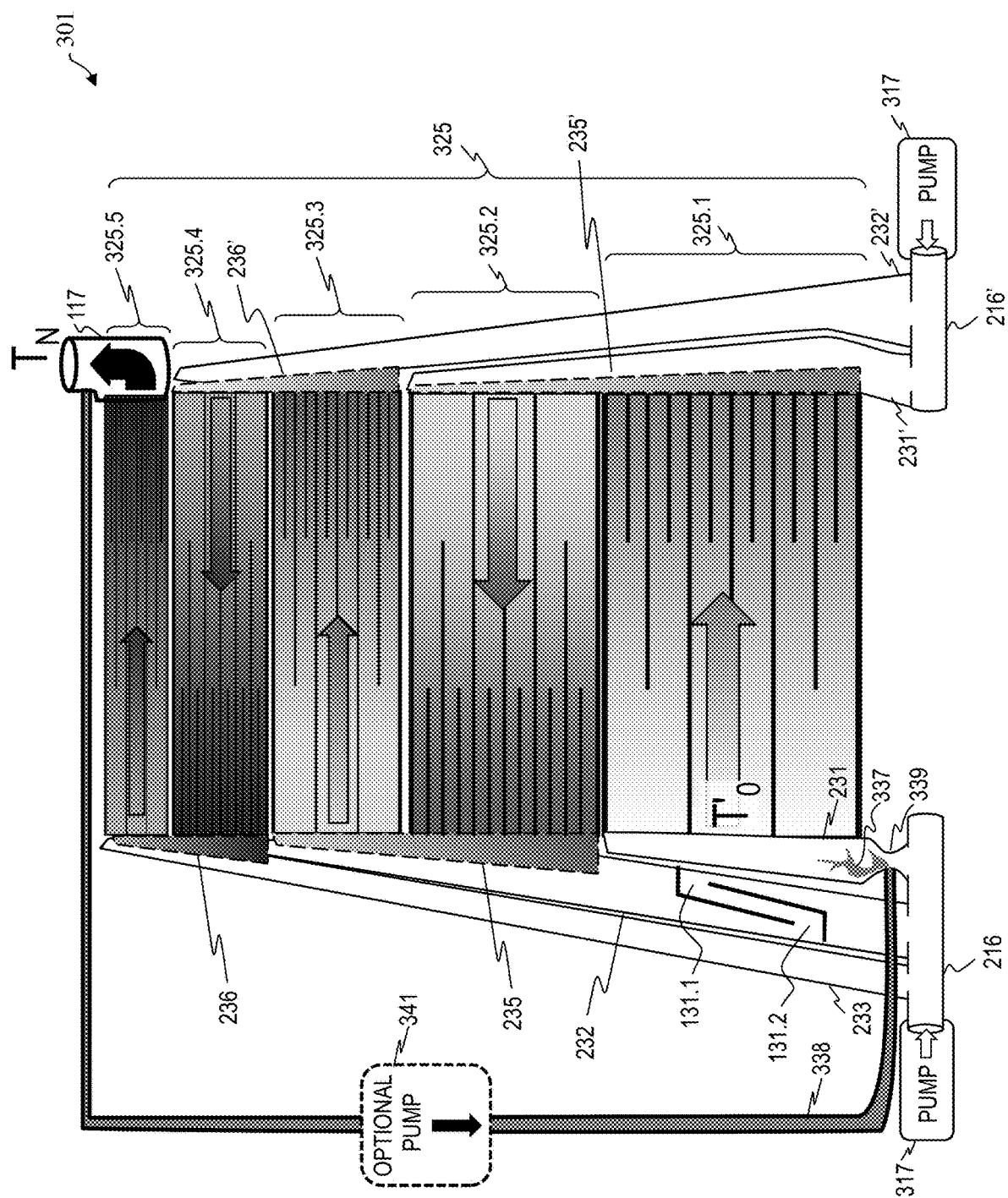
FIG. 3 is a schematic diagram of a temperature-control system 301, according to some embodiments of the present invention.

FIG. 3 is a schematic diagram of a temperature-control system 301, according to some embodiments of the present invention. In some embodiments, system 301 is substantially similar to system 201, except that system 301 includes a plurality of channel segments 325 (e.g., segment 325.1, segment 325.2, segment 325.3, segment 325.4, and segment 325.5), each respective segment 325 having an increased number of channels (formed by an increased number of channel walls or heat-transfer vanes) on the downstream end of the respective segment 325 as compared to the upstream end of the respective segment 325. In some embodiments, one or more pumps 317 increase the pressure of the input heat-transfer fluid so that heat-transfer fluid flows from the input ports 216 and 216' through the laser-diode-cooling apparatus to the output port 117. In some such embodiments, the increased number of channels on the downstream end of a segment 325 increases the amount of heat transferred away from the heat source via conduction at the downstream end and also increases the amount of heat transferred away from the channel walls into the heat-exchange fluid 99 at the downstream end due to the increased flow velocity of the heat-transfer fluid at the downstream end. In some embodiments, a small portion of hot downstream fluid from outlet 117 is conveyed through passageway 338 and mixed (shown by reference number 337) with cold input coolant (heat-transfer fluid) that is being pumped into conduit 231 at the input to conduit 231. In some embodiments, the lower-pressure hot fluid is introduced through a side port of venturi 339 into the higher-pressure higher-velocity cold fluid in order that the low-pressure hot fluid can be inserted into the higher-pressure cold input fluid. This mixing warms the input fluid's temperature $T_0$ somewhat (to temperature $T'_0$), in order that all of the laser pump diodes are maintained at more-equal temperatures. In other embodiments, a pump 341 is added to passageway 338 between output port 117 and conduit 231 (as a substitute for, or in addition to, the function of venturi 339) to increase the pressure of the hot fluid from output port 117 in order that it can be pushed into the incoming heat-transfer fluid that has a higher pressure than the outgoing fluid at output port 117.

Figure 4:
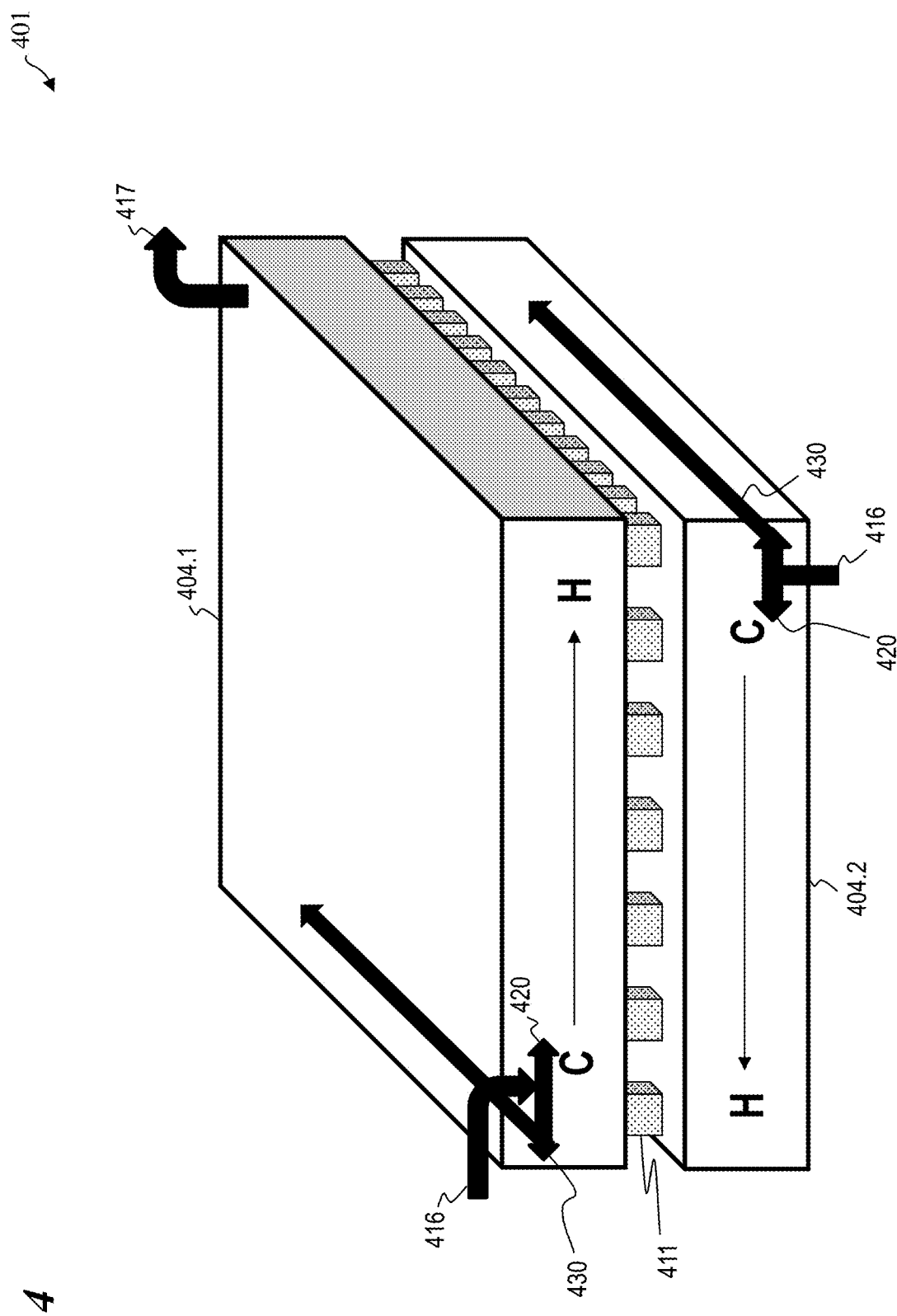
FIG. 4 is a schematic perspective view diagram of a temperature-control system 401, according to some embodiments of the present invention.

FIG. 4 is a schematic perspective view diagram of a temperature-control system 401, according to some embodiments of the present invention. In some embodiments, system 401 includes a plurality of heat-transfer modules (e.g., upper heat-transfer module 404.1 and lower heat-transfer module 404.2), located on a plurality of faces of the plurality of electronic devices 411 whose temperature is being controlled. In some embodiments such as shown in FIG. 4, the plurality of electronic devices 411 is sandwiched between upper heat-transfer module 404.1 and lower heat-transfer module 404.2. In some such embodiments, each heat-transfer module is implemented as heat exchanger 106 of FIG. 1C. In other embodiments (not shown in FIG. 4), heat-transfer module 404.1 is positioned above second heat-transfer module 404.2 such that heat sources 411 coupled to heat-transfer module 404.2 are facing separate heat sources 411 located on heat-transfer module 404.1.

In some embodiments, each heat-transfer module is thermally coupled to a plurality of heat sources 411 (e.g., in some embodiments, a plurality of pump-laser diodes, a plurality of electronic devices/components, or any other suitable heat sources). In some embodiments, each heat-transfer module includes a heat sink such as heat spreader 115 of FIG. 1B and a heat-exchange-fluid flow structure such as structure 105 of FIG. 1B (in some such embodiments, the heat-exchange-fluid flow structure in each heat-transfer module includes a first branch 420 and a second branch 430).

In some embodiments, the present invention provides an apparatus that includes a plurality of heat sources; a heat sink coupled to the plurality of heat sources; and a heat-exchange-fluid flow path for heat-exchange fluid to flow through such that heat is removed from the first heat sink, wherein the flow path includes: a heat-exchange-fluid inlet, wherein heat-exchange fluid enters the flow path via the inlet, a first branch, wherein the first branch includes a plurality of segments including a first segment and a second segment adjacent to the first segment, wherein each of the plurality of segments includes an upstream end and a downstream end, wherein a first portion of the heat-exchange fluid flows through the first branch in a parallel-flow configuration such that the first portion of the heat-exchange fluid flows through the first segment in a first direction and the first portion of the heat-exchange fluid flows through the second segment in a second direction, opposite the first direction, and a second branch, wherein a second portion of the heat-exchange fluid flows through the second branch such that the second portion of the heat-exchange fluid mixes with the downstream end of the second segment. In some embodiments, the first heat sink and the first heat-exchange-fluid flow path are formed of a single-piece construction.

In some embodiments of the apparatus, the first segment includes a first plurality of parallel flow channels, each channel having a first channel width. In some embodiments, the first segment includes a first plurality of parallel flow channels, each channel having a first channel cross-sectional area, wherein the second segment includes a second plurality of parallel flow channels, each channel having a second channel cross-sectional area, and wherein the second channel width is smaller than the first channel cross-sectional area.

In some embodiments, the present invention provides an apparatus that includes a first plurality of heat sources; a first heat sink coupled to the first plurality of heat sources; and a first heat-exchange-fluid flow path, wherein the first heat sink is thermodynamically coupled to the first flow path, wherein the first flow path includes: a first heat-exchange-fluid inlet, wherein heat-exchange fluid enters the first flow path via the first heat-exchange-fluid inlet, a first branch, wherein the first branch includes a plurality of segments including a first segment and a second segment adjacent to the first segment, wherein each of the plurality of segments includes an upstream end and a downstream end, wherein a first portion of the heat-exchange fluid flows through the first branch such that the first portion of the heat-exchange fluid flows through the first segment in a first direction and the first portion of the heat-exchange fluid flows through the second segment in a second direction, opposite the first direction, a second branch, wherein a second portion of the heat-exchange fluid flows through the second branch such that the second portion of the heat-exchange fluid mixes with the downstream end of the second segment.

In some embodiments of the apparatus, the first segment includes a first plurality of flow channels, each of the first plurality of channels having a first channel width. In some embodiments, the first segment includes a first plurality of flow channels, each of the first plurality of channels having a first channel width, wherein the second segment includes a second plurality of flow channels, each of the second plurality of channels having a second channel width, and wherein the second channel width is narrower than the first channel width.

In some embodiments of the apparatus, the first segment includes a first number of flow channels near the upstream end of the first segment, wherein the first segment includes a second number of flow channels near the downstream end of the first segment, and wherein the second number is larger than the first number.

In some embodiments of the apparatus, the first flow path further includes a second heat-exchange-fluid inlet located on a second side of the apparatus, opposite the first side, and wherein heat-exchange fluid entering the flow path via the second heat-exchange-fluid inlet mixes with the downstream end of the first segment.

In some embodiments of the apparatus, the first flow path further includes: a second heat-exchange-fluid inlet located on a second side of the apparatus, opposite the first side, wherein heat-exchange fluid entering the flow path via the second heat-exchange-fluid inlet mixes with the downstream end of the first segment, and a third heat-exchange-fluid inlet located at a middle location of the apparatus such that heat-exchange fluid entering the first flow path via the third heat-exchange-fluid inlet mixes with a midstream portion of the first segment.

In some embodiments of the apparatus, the first segment includes a first plurality of flow channels, each of the first plurality of channels having a first channel width, wherein the first flow path further includes a second heat-exchange-fluid inlet located on a second side of the apparatus, opposite the first side, and wherein heat-exchange fluid entering the flow path via the second heat-exchange-fluid inlet mixes with the downstream end of the first segment. In some embodiments, the first segment includes a first plurality of flow channels, each of the first plurality of flow channels having a first channel width, wherein the second segment includes a second plurality of flow channels, each of the second plurality of flow channels having a second channel width, wherein the second channel width is narrower than the first channel width, and wherein the first flow path further includes: a second heat-exchange-fluid inlet located on a second side of the apparatus, opposite the first side, wherein heat-exchange fluid entering the flow path via the second heat-exchange-fluid inlet mixes with the downstream end of the first segment, and a third heat-exchange-fluid inlet located at a middle location of the apparatus such that heat-exchange fluid entering the first flow path via the third heat-exchange-fluid inlet mixes with a midstream portion of the first segment.

In some embodiments of the apparatus, the first flow path further includes a second heat-exchange-fluid inlet located on a second side of the apparatus, opposite the first side, wherein heat-exchange fluid entering the flow path via the second heat-exchange-fluid inlet mixes with the downstream end of the first segment, wherein the first segment includes a first number of flow channels near the upstream end of the first segment, wherein the first segment includes a second number of flow channels near the downstream end of the first segment, and wherein the second number is larger than the first number.

In some embodiments of the apparatus, the second branch includes a pressure-control section configured to balance a first pressure drop of the first portion of the heat-exchange fluid in the first branch with a second pressure drop of the second portion of the heat-exchange fluid in the second branch. In some embodiments, the pressure-control section includes a plurality of U-turns.

In some embodiments, the apparatus further includes a second plurality of heat sources; a second heat sink coupled to the second plurality of heat sources; and a second heat-exchange-fluid flow path, wherein the second heat sink is thermodynamically coupled to the second flow path, wherein the second flow path is substantially similar to the first flow path, wherein the first heat sink and the second heat sink are arranged next to each other such that the first plurality of heat sources is across from the second plurality of heat sources.

In some embodiments, the present invention provides a method for controlling the temperature of a plurality of heat sources, the method including providing a heat sink; coupling the plurality of heat sources to the heat sink; providing a first heat-exchange-fluid flow path for heat-exchange fluid to flow through such that heat is removed from the first heat sink, wherein the first heat-exchange-fluid flow path includes: a first branch, wherein the first branch includes a plurality of segments including a first segment and a second segment adjacent to the first segment, wherein each of the plurality of segments includes an upstream end and a downstream end, and a second branch; the method further including coupling the heat-exchange-fluid flow path to the heat sink; inserting the heat-exchange fluid into the heat-exchange-fluid flow path; flowing a first portion of the heat-exchange fluid through the first branch such that the first portion of the heat-exchange fluid flows through the first segment in a first direction and the first portion of the heat-exchange fluid flows through the second segment in a second direction, opposite the first direction; and flowing a second portion of the heat-exchange fluid through the second branch such that the second portion of the heat-exchange fluid mixes with the downstream end of the second segment.

In some embodiments, the method further includes forming the first heat sink and the first heat-exchange-fluid flow path of a single-piece construction.

In some embodiments of the method, the flowing of the first portion of the heat-exchange fluid through the first branch includes sending the heat-exchange fluid through a first plurality of channels in the first segment and through a second plurality of channels in the second segment. In some embodiments, the flowing of the first portion of the heat-exchange fluid through the first branch includes: sending the first portion of the heat-exchange fluid through a first plurality of channels in the first segment, and sending the first portion of the heat-exchange fluid through a second plurality of channels in the second segment, wherein the first plurality of channels has a first width, wherein the second plurality of channels has a second width, and wherein the second width is narrower than the first width.

In some embodiments of the method, the flowing of the first portion of the heat-exchange fluid through the first branch includes: sending the first portion of the heat-exchange fluid through a first number of channels near the upstream end of the first segment, and sending the first portion of the heat-exchange fluid through a second number of channels near the downstream end of the first segment, wherein the second number is larger than the first number. In some embodiments, the flowing of the first portion of the heat-exchange fluid through the first branch includes controlling a first pressure drop of the first portion of the heat-exchange fluid in the first branch, and wherein the flowing of the second portion of the heat-exchange fluid through the second branch includes controlling a second pressure drop of the second portion of the heat-exchange fluid in the second branch. In some embodiments, the method further includes inserting the heat-exchange fluid into the first heat-exchange-fluid flow path at second inlet location.

In some embodiments, the present invention provides an apparatus that includes a first plurality of heat sources; a first heat sink coupled to the first plurality of heat sources; and means for removing heat from the first heat sink. Some embodiments further include a second heat sink thermally coupled to the first plurality of heat sources; and a second heat-exchange-fluid flow path, wherein the second heat sink is thermodynamically coupled to the second flow path, wherein the second flow path is substantially similar to the first flow path, wherein the first heat sink and the second heat sink are arranged across from one another with the first plurality of heat sources located therebetween.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An apparatus comprising:
   a first plurality of heat sources;
   a first heat sink coupled to the first plurality of heat sources; and
   a first heat-exchange-fluid flow path for heat-exchange fluid to flow through such that heat is removed from the first heat sink, wherein the first flow path includes:
      a first heat-exchange-fluid inlet located on a first side of the apparatus, wherein the heat-exchange fluid enters the first flow path via the first heat-exchange-fluid inlet at a first temperature,
      a first branch thermally coupled to a first subset of the first plurality of heat sources, wherein the first branch includes a plurality of segments including a first segment and a second segment adjacent to the first segment, wherein each of the plurality of segments includes an upstream end and a downstream end, wherein a first portion of the heat-exchange fluid flows through the first branch such that the first portion of the heat-exchange fluid flows through the first segment in a first direction and the first portion of the heat-exchange fluid flows through the second segment in a second direction, opposite the first direction, and
      a second branch that starts where the first heat-exchange-fluid flow path splits into the first branch and the second branch and ends at a mix location where the first branch reconnects with the second branch, wherein a second portion of the heat-exchange fluid flows through the second branch and then mixes with the downstream end of the second segment at the mix location, and wherein the second portion of the heat-exchange fluid remains at the first temperature as it flows through the second branch.

2. The apparatus of claim 1, wherein the first segment includes a first plurality of parallel flow channels, each of the first plurality of flow channels having a first channel cross-sectional area.

3. The apparatus of claim 1, wherein the first segment includes a first plurality of parallel flow channels, each of the first plurality of parallel flow channels having a first channel cross-sectional area, wherein the second segment includes a second plurality of parallel flow channels, each of the second plurality of parallel flow channels having a second channel cross-sectional area, and wherein the second channel cross-sectional area is smaller than the first channel cross-sectional area.

4. The apparatus of claim 1, wherein the first segment includes a first number of parallel flow channels near the upstream end of the first segment, wherein the first segment includes a second number of parallel flow channels near the downstream end of the first segment, and wherein the second number is larger than the first number.

5. An apparatus comprising:
   a first plurality of heat sources;
   a first heat sink coupled to the first plurality of heat sources; and
   a first heat-exchange-fluid flow path for heat-exchange fluid to flow through such that heat is removed from the first heat sink, wherein the first flow path includes:
      a first heat-exchange-fluid inlet located on a first side of the apparatus, wherein the heat-exchange fluid enters the first flow path via the first heat-exchange-fluid inlet,
      a first branch, wherein the first branch includes a plurality of segments including a first segment and a second segment adjacent to the first segment, wherein each of the plurality of segments includes an upstream end and a downstream end, wherein a first portion of the heat-exchange fluid flows through the first branch such that the first portion of the heat-exchange fluid flows through the first segment in a first direction and the first portion of the heat-exchange fluid flows through the second segment in a second direction, opposite the first direction, and
      a second branch, wherein a second portion of the heat-exchange fluid flows through the second branch such that the second portion of the heat-exchange fluid mixes with the downstream end of the second segment, wherein the first flow path further includes a second heat-exchange-fluid inlet located on a second side of the apparatus, opposite the first side, and wherein heat-exchange fluid entering the flow path via the second heat-exchange-fluid inlet mixes with the downstream end of the first segment.

6. The apparatus of claim 1, wherein the first flow path further includes:
   a second heat-exchange-fluid inlet located on a second side of the apparatus, opposite the first side, wherein heat-exchange fluid entering the flow path via the second heat-exchange-fluid inlet mixes with the downstream end of the first segment, and
   a third heat-exchange-fluid inlet located at a middle location of the apparatus such that heat-exchange fluid entering the first flow path via the third heat-exchange-fluid inlet mixes with a midstream portion of the first segment.

7. The apparatus of claim 5, wherein the first segment includes a first plurality of parallel flow channels.

8. The apparatus of claim 1, wherein the first segment includes a first plurality of parallel flow channels, each of the first plurality of parallel flow channels having a first channel cross-sectional area, wherein the second segment includes a second plurality of parallel flow channels, each of the second plurality of parallel flow channels having a second channel cross-sectional area, wherein the second channel cross-sectional area is smaller than the first channel cross-sectional area, and wherein the first flow path further includes:
   a second heat-exchange-fluid inlet located on a second side of the apparatus, opposite the first side, wherein heat-exchange fluid entering the flow path via the second heat-exchange-fluid inlet mixes with the downstream end of the first segment, and
   a third heat-exchange-fluid inlet located at a middle location of the apparatus such that heat-exchange fluid entering the first flow path via the third heat-exchange-fluid inlet mixes with a midstream portion of the first segment.

9. The apparatus of claim 1, wherein the second branch includes a pressure-control section configured to balance a first pressure drop of the first portion of the heat-exchange fluid in the first branch with a second pressure drop of the second portion of the heat-exchange fluid in the second branch.

10. The apparatus of claim 1, wherein the second branch includes a pressure-control section configured to balance a first pressure drop of the first portion of the heat-exchange fluid in the first branch with a second pressure drop of the second portion of the heat-exchange fluid in the second branch, and wherein the pressure-control section includes a plurality of U-turns.

11. The apparatus of claim 5, wherein the first segment includes a first number of parallel flow channels near the upstream end of the first segment, wherein the first segment includes a second number of parallel flow channels near the downstream end of the first segment, and wherein the second number is larger than the first number.

12. The apparatus of claim 1, further comprising:
a second heat sink thermally coupled to the first plurality of heat sources; and
a second heat-exchange-fluid flow path, wherein the second heat sink is thermodynamically coupled to the second flow path, wherein the second flow path is substantially similar to the first flow path, wherein the first heat sink and the second heat sink are arranged across from one another with the first plurality of heat sources located therebetween.

13. A method for controlling the temperature of a first plurality of heat sources, the method comprising:
providing a first heat sink;
coupling the first plurality of heat sources to the first heat sink;
providing a first heat-exchange-fluid flow path for heat-exchange fluid to flow through such that heat is removed from the first heat sink, wherein the first heat-exchange-fluid flow path includes:
a first branch thermally coupled to a first subset of the first plurality of heat sources, wherein the first branch includes a plurality of segments including a first segment and a second segment adjacent to the first segment, wherein each of the plurality of segments includes an upstream end and a downstream end, and
a second branch that starts where the first heat-exchange-fluid flow path splits into the first branch and the second branch and ends at a mix location where the first branch reconnects with the second branch;
inserting the heat-exchange fluid at a first temperature into the first heat-exchange-fluid flow path at a first inlet location;
flowing a first portion of the heat-exchange fluid through the first branch such that the first portion of the heat-exchange fluid flows through the first segment in a first direction and the first portion of the heat-exchange fluid flows through the second segment in a second direction, opposite the first direction;
flowing a second portion of the heat-exchange fluid through the second branch, wherein the second portion of the heat-exchange fluid remains at the first temperature as it flows through the second branch; and
mixing the second portion of the heat-exchange fluid that has flowed through the second branch with the downstream end of the second segment at the mix location.

14. The method of claim 13, further comprising forming the first heat sink and the first heat-exchange-fluid flow path of a single-piece construction.

15. The method of claim 13, wherein the flowing of the first portion of the heat-exchange fluid through the first branch includes sending the heat-exchange fluid through a first plurality of channels in the first segment and through a second plurality of channels in the second segment.

16. The method of claim 13, wherein the flowing of the first portion of the heat-exchange fluid through the first branch includes:
sending the first portion of the heat-exchange fluid through a first plurality of channels in the first segment, and
sending the first portion of the heat-exchange fluid through a second plurality of channels in the second segment, wherein the first plurality of channels has a first cross-sectional area, wherein the second plurality of channels has a second cross-sectional area, and wherein the second cross-sectional area is smaller than the first cross-sectional area.

17. The method of claim 13, wherein the flowing of the first portion of the heat-exchange fluid through the first branch includes:
sending the first portion of the heat-exchange fluid through a first number of channels near the upstream end of the first segment, and
sending the first portion of the heat-exchange fluid through a second number of channels near the downstream end of the first segment, wherein the second number is larger than the first number.

18. The method of claim 13, wherein the flowing of the first portion of the heat-exchange fluid through the first branch includes controlling a first pressure drop of the first portion of the heat-exchange fluid in the first branch, and wherein the flowing of the second portion of the heat-exchange fluid through the second branch includes controlling a second pressure drop of the second portion of the heat-exchange fluid in the second branch.

19. The method of claim 13, further comprising inserting the heat-exchange fluid into the first heat-exchange-fluid flow path at second inlet location.

20. An apparatus comprising:
a first plurality of heat sources;
a second plurality of heat sources;
first means for removing heat from the first plurality of heat sources, wherein the first means for removing heat includes a first plurality of parallel flow channels, each of the first plurality of parallel flow channels having a first channel cross-sectional area perpendicular to a flow direction through the first plurality of parallel flow channels,
means for supplying cooling fluid at a first temperature to the first means for removing heat;
second means for removing heat from the second plurality of heat sources, wherein the second means for removing heat includes a second plurality of parallel flow channels, each of the second plurality of parallel flow channels having a second channel cross-sectional area perpendicular to a flow direction through the second plurality of parallel flow channels, and wherein the second channel cross-sectional area is smaller than the first channel cross-sectional area; and
means for supplying cooling fluid at the first temperature to a mixing location at a downstream end of the first means for removing heat to form a first mixed fluid, wherein all of the first mixed fluid flows through the second plurality of parallel flow channels, wherein the first means for removing heat is configured such that the cooling fluid flows through the first plurality of parallel flow channels in a first direction and the cooling fluid flows through the second plurality of parallel flow channels in a second direction, opposite the first direction.

21. The apparatus of claim 1, further comprising:
a second heat sink thermally coupled to the first plurality of heat sources; and
a second heat-exchange-fluid flow path, wherein the second heat sink is thermodynamically coupled to the second flow path, wherein the second flow path has a temperature gradient in an opposite spatial direction compared to that of the first flow path, wherein the first heat sink and the second heat sink are arranged across from one another with the first plurality of heat sources located therebetween.

22. The apparatus of claim 20, wherein the first plurality of parallel flow channels includes a first number of parallel flow channels on an upstream end of the first means for removing heat from the first plurality of heat sources, and a second number of parallel flow channels on a downstream end of the first means for removing heat from the first plurality of heat sources, and wherein the second number is larger than the first number.

23. The apparatus of claim 20, wherein the means for supplying cooling fluid at the first temperature to a mixing location at the downstream end of the first means for removing heat includes a pressure-control section.

* * * * *